US007069486B2

(12) United States Patent
Nagamine et al.

(10) Patent No.: US 7,069,486 B2
(45) Date of Patent: Jun. 27, 2006

(54) TEST CIRCUIT FOR LOGICAL INTEGRATED CIRCUIT AND METHOD FOR TESTING SAME

(75) Inventors: Ryouichirou Nagamine, Kanagawa (JP); Yasuteru Makita, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 571 days.

(21) Appl. No.: 10/026,532

(22) Filed: Dec. 27, 2001

(65) Prior Publication Data

US 2002/0087929 A1    Jul. 4, 2002

(30) Foreign Application Priority Data

Dec. 28, 2000  (JP) ............... 2000-399886

(51) Int. Cl.
*G01R 31/28* (2006.01)
(52) U.S. Cl. .................................... 714/729
(58) Field of Classification Search ............... 714/724, 714/726, 740, 729; 324/104; 365/20, 199
See application file for complete search history.

(56) References Cited

U.S. PATENT DOCUMENTS

| 5,544,173 A * | 8/1996 | Meltzer ...................... 714/726 |
| 6,199,182 B1 * | 3/2001 | Whetsel ...................... 714/724 |
| 6,343,365 B1 * | 1/2002 | Matsuzawa et al. ........ 714/726 |
| 6,574,760 B1 * | 6/2003 | Mydill ....................... 714/724 |

FOREIGN PATENT DOCUMENTS

| JP | 404050783 A * | 4/1992 |
| JP | 02000097997 A * | 4/2000 |
| JP | P3092704 | 7/2000 |
| TW | 413981 A * | 12/2000 |

OTHER PUBLICATIONS

"IDDQ and AC Scan: The War Against Unmodelled Defects" by Maxwell et al. International Test Conference Proceedings Publication Date: Oct. 20-25, 1996, pp. 250-258 Inspec Accession Number: 5539851.*
"The Testability Features of the 3rd Generation ColdFire(R) Family of Microprocessors" by Crouch et al. International Test Conference Proceedings Publication Date: Sep. 28-30, 1999, pp. 913-922 Inspec Accession Number: 6536446.*
"Analogue Boundary Scan Architecture for DC and AC Testing" by Kuen-Jong Lee et al. Electronics Letters Publication Date: Apr. 1, 1996, pp. 704-705 vol. 32 , Issue: 8 Inspec Accession Number: 5251377.*

* cited by examiner

*Primary Examiner*—Albert Decady
*Assistant Examiner*—Cynthia Britt
(74) *Attorney, Agent, or Firm*—McGinn IP Law Group, PLLC

(57) ABSTRACT

A scan path is formed by successively connecting the flip-flop FF11x located at the head of the xth stage to the flip-flop FF1mx located at the end of the xth stage in series. The scan path connects the scan input SIN with the input terminal of the flip-flop FF11n located at the head of the nth stage, and successively connects the flip-flop arranged in the second to (n−1)th stages in series, after restarting from the output terminal of the flip-flop FF1nm located at the end of the nth stage. The output terminal of the flip-flop FF1m(n−1) located at the end of the (n−1)th stage is connected with the input terminal of the flip-flop FF111 located at the head of the first stage, and, finally, the output terminal of the flip-flop FF1m1 located at the end of the first stage is connected with the scan output SOT.

14 Claims, 5 Drawing Sheets

IN1 TO INj: INPUT TERMINALS
OT1 TO OTm: OUTPUT TERMINALS
SIN: SCAN INPUT
SOT: SCAN OUTPUT
SE: SCAN ENABLE TERMINAL
CLK: CLOCK SIGNAL INPUT TERMINAL
FF: FLIP-FLOP

IN1 TO INj: INPUT TERMINALS
OT1 TO OTm: OUTPUT TERMINALS
SIN: SCAN INPUT
SOT: SCAN OUTPUT
SE: SCAN ENABLE TERMINAL
CLK: CLOCK SIGNAL INPUT TERMINAL
FF: FLIP-FLOP

IN1 TO INj: INPUT TERMINALS
OT1 TO OTm: OUTPUT TERMINALS
SIN: SCAN INPUT
SOT: SCAN OUTPUT
SE: SCAN ENABLE TERMINAL
CLK: CLOCK SIGNAL INPUT TERMINAL
FF: FLIP-FLOP

IN1 TO INj: INPUT TERMINALS
OT1 TO OTm: OUTPUT TERMINALS
SIN: SCAN INPUT
SOT: SCAN OUTPUT
SE: SCAN ENABLE TERMINAL
CLK: CLOCK SIGNAL INPUT TERMINAL
FF: FLIP-FLOP

IN1 TO INj: INPUT TERMINALS
OT1 TO OTm: OUTPUT TERMINALS
SIN: SCAN INPUT
SOT: SCAN OUTPUT

SE: SCAN ENABLE TERMINAL
CLK: CLOCK SIGNAL INPUT TERMINAL
FF: FLIP-FLOP

TEST CIRCUIT FOR LOGICAL INTEGRATED CIRCUIT AND METHOD FOR TESTING SAME

BACKGROUND OF THE INVENTION

The present invention relates to a test circuit for a logical integrated circuit, and to a method for testing the same, which measure an alternating current (AC, hereinafter) characteristic of a logical integrated circuit by using a scan path technique in which plural flop-flops (FFs, hereinafter) of the scanning type are successively connected in series and a test pattern is propagated therealong. The invention relates especially to a test circuit for a logical integrated circuit, and to a method for testing the same, in which time spent in measuring an AC characteristic of each of the input and output terminals of the logical integrated circuit can be shortened.

FIELD OF THE INVENTION

A scan path technique is a DFT (design for test) technique used for simplifying generating of a test pattern of a logical integrated circuit which is increasing its scale steadily. The technique makes it possible to control or to observe a state of a desired FF by relacing the FFs in the logical integrated with FFs of the scanning type. Since a sequence circuit can be treated as a combinational circuit by using the scan path technique, the test pattern which has previously been written out manually can be written out automatically with an Automatic Test Pattern Generator (ATPG, hereinafter) in combination with the scan path technique, and the time necessary for writing out the test pattern can be significantly reduced.

With a ATPG, it becomes possible to write out a test pattern which is applied only to a desired portion on the logical integrated circuit, such as an interval between given FFs for instance, so that the data are distributed thereon in a desired state. By utilizing the aforementioned feature, the test pattern to be applied to a path between an external terminal and a desired FF is written out, and the AC characteristics, such as a transition time, a set up time, a hold time, etc. of a waveform of an output signal of the logical integrated circuit are measured on a Large Scale Integrated circuit (LSI, hereinafter) tester.

With the development of the scan path technique, it becomes possible to generate a test pattern for measuring AC characteristics of the input and output terminals of the logical integrated circuit. Accordingly, the number of the test patterns can be decreased as compared with the conventional method for inspecting the AC characteristics of the logical integrated circuit, and the test time is shortened. However, in the present situation, shortening of the test time is further desired in order to decrease the cost of the device.

When the test pattern is generated by using the scan path technique, and the scan path is very long, it takes a significant amount of testing time to shift the pattern through the entire scan path. This situation is caused by the fact that the data captured in an ordinary mode is successively shifted on the scan path in the scan shift mode till the data arrives at the external terminal. Since the scan path is long in a large scale integrated circuit, time spent in the scan shift mode becomes long, and the number of the test patterns and the test time increase as a result.

For example, the test circuit 400 shown in FIG. 1 is composed of m×n FFs arranged in the form of a matrix, in which the m FFs FF411, FF421 to FF4m1 form the first (front) stage located the closest to the input terminals of the test circuit, the m FFs FF412, FF422 to FF42m form the second stage of the same, and so on. Finally, the m FFs FF41n, FF42n to FF4mn form the nth (final) stage located the closest to the output terminals of the test circuit. As mentioned above, the test circuit is composed of n stages, each of which is composed of m FFs.

In the scan path in the conventional test circuit 400 shown in FIG. 1, a scan input SIN is connected with an input terminal of FF411 located at the head of the first stage. Thereafter, FF411, FF421 to FF4m1 are successively connected in series in the first stage. Then, an output terminal Q of the FF4m1 located at the end of the first stage, is connected with an input terminal of FF412 located at the head of the second stage, and FF412, FF422 to FF42m are successively connected in series in the second stage. After similar processes are repeated in the respective stages, all the FFs arranged in the first to nth stages are successively connected in series, and, finally, an output terminal Q of FF4mn located at the end of the nth stage, is connected with a scan output SOT.

Next, a procedure for generating a test pattern which measures the AC characteristic of the input terminal of the test circuit shown FIG. 1 will be considered. Since the signal taken in a FF is successively shifted to the following FF on the scan path till the signal propagates to the scan output SOT, when there are 50,000(=m×n) FFs on the scan path and the test signal supplied from the input terminal IN1 is taken in the FF411 standing at the head of the first stage of the test circuit, it becomes necessary to repeat the scan shifts 50,000 times till the signal supplied from the input terminal IN1 propagates to the scan output SOT.

On the other hand, when a test pattern for measuring the AC characteristics of the output terminals OT1 to OTm is generated, since the signal is transmitted to the scan output SOT, it is necessary to repeat the scan shifts 50,000 times, because there are 50,000 FFs on the scan path which extends to the FF4mn located at the end of the nth stage of the test circuit.

In general, the FFs on the scan path are connected in the order of the name of the FF, by using a scan path-inserting tool, as shown in FIG. 1. As a result, there arise inconveniences, in that many scan shifts are necessary in some cases, as mentioned above, and an increase in the number of test patterns and the time spent in the test are brought upon.

With an object of resolving the point at issue, that time spent in generating the test patterns or in performing a board test increases in the large scale integrated circuit, an integrated circuit and a method for testing the same are disclosed in Japanese Patent, No. 309204.

In the aforementioned test circuit 500 shown in FIG. 2, a scan input SIN is connected with an input terminal of FF511 located at the head of the first stage of the test circuit, and FF511 to FF5m1 are connected in series similarly to the test circuit shown FIG. 1. However, the output terminal of FF5m1 is connected with an input terminal of FF51n located at the head of the nth stage of the test circuit, and, thereafter, FF51n to FF5mn are connected in series. The output terminal of FF5mn located at the end of the nth stage, is connected with a first terminal of a selector 501.

The output terminal of FF5mn located at the end of the nth stage of the test circuit is connected with an input terminal of the FF512 located at the head of the second stage of the test circuit. The FFs arranged in the second to (n−1)th stages (the internal FFs, hereinafter) are successively connected in series, the output of the last one of which is connected with a second input terminal of selector 501. The selector 501 selects either a scan path formed only of the FFs standing the closest to the input and output terminals or the other scan path formed of all the FFs arranged in the integrated circuit, and connects the end of the selected scan path with the scan output SOT. Accordingly, time spent in measuring the AC characteristic of each of the input and output terminals is determined depending only on the number of the scan shifts on the scan path which is formed only of the FFs standing the closest to the input and output terminals.

However, there is yet room for improvement in the conventional test circuit for the logical integrated circuit shown in FIG. 2, and whether the test time can be further decreased or not is open to discussion.

That is to say, when a test pattern is inputted from the input terminal INx, it is necessary to scan all the FFs on the scan path which ranges from the input terminal INx to the m FFs standing the closest to the output terminals in order to output the data from the scan output SOT.

SUMMARY OF THE INVENTION

Accordingly, it is an object of the invention to overcome the aforementioned problems, and to provide a test circuit for a logical integrated circuit and a method for testing the same in which time spent in measuring AC characteristics of input and output terminals of a logical integrated circuit can be further reduced.

According to a first feature of the invention, a test circuit for a logical integrated circuit comprises:

plural flip-flops of a scanning type (FFs, hereinafter) arranged in n stages, in each stage of which the FFs are successively connected in series, plural logic gates, output terminals of which are respectively connected with input terminals of the plural FFs, and a scan path which is formed of a series connection of a part or all of the plural FFs, and which propagates a test pattern for measuring an AC characteristic of an input or output terminal of the logical integrated circuit, wherein the scan path connects an output terminal of the FF located at the end of the first stage with a scan output.

According to a second feature of the invention, a test circuit for a logical integrated circuit comprises:

plural FFs arranged in n stages, in each stage of which the FFs are successively connected in series, plural logic gates, output terminals of which are respectively connected with input terminals of the plural FFs, and a scan path which is formed of a series connection of a part or all of the plural FFs, and which propagates a test pattern for measuring an AC characteristic of an input or output terminal of the logical integrated circuit, wherein the scan path connects a scan input with an input terminal of the FF located at the head of the nth stage.

According to a third feature of the invention, a test circuit for a logical integrated circuit comprises:

plural FFs arranged in n stages, in each stage of which the FFs are successively connected in series, plural logic gates, output terminals of which are respectively connected with input terminals of the plural FFs, and a scan path which is formed of a series connection of a part or all of the plural FFs, and which propagates a test pattern for measuring an AC characteristic of an input or output terminal of the logical integrated circuits, wherein the scan path connects a scan input with an input terminal of the FF located at the head of the nth stage, again successively connects the FFs arranged in the second to (n−1) th stages in series, after restarting from an output terminal of the FF located at the end of the nth stage, once again connects an output terminal of the FF located at the end of the (n−1) th stage with an input terminal of the FF located at the head of the first stage, and finally connects an output terminal of the FF located at the end of the first stage with a scan output.

According to the aforementioned structures, a test pattern inputted to an input terminal of the test circuit is transmitted to the scan output, after the scan shifts are repeated only in the FFs arranged in the first stage. On the other hand, a test pattern inputted to the scan input is transmitted to each of the output terminals of the test circuit, after the scan shifts are repeated only in the FFs arranged in the nth stage.

According to a fourth feature of the invention, a method for testing a logical integrated circuit, which comprises:

plural FFs arranged in n stages, in each stage of which the FFs are successively connected in series, plural logic gates, output terminals of which are respectively connected with input terminals of the plural FFs, and a scan path which is formed of a series connection of a part or all of the plural FFs, and which propagates a test pattern for measuring an AC characteristic of an input or output terminal of the logical integrated circuit, comprises the steps of:

connecting an output terminal of the FF located at the end of the first stage with a scan output, inputting a clock signal to a clock signal input terminal, inputting a predetermined data signal to one of the input terminals of the logical integrated circuit, and measuring the AC characteristic of the one of the input terminals of the logical integrated circuit by inspecting an output of the scan output.

According to a fifth feature of the invention, a method for testing a logical integrated circuit, which comprises:

plural FFs arranged in n stages, in each stage of which the FFs are successively connected in series, plural logic gates, output terminals of which are respectively connected with input terminals of the plural FFs, and a scan path which is formed of a series connection of a part or all of the plural FFs, and which propagates a test pattern for measuring an AC characteristic of an input or output terminal of the logical integrated circuit, comprises the steps of:

connecting a scan input with an input terminal of the FF located at the head of the nth stage, inputting a clock signal to a clock signal input terminal, inputting a predetermined data signal to a scan input, and measuring an AC characteristic of one of the output terminals of the logical integrated circuit by inspecting an output of the one of the output terminals.

According to a sixth feature of the invention, a method for testing a logical integrated circuit, which comprises:

plural FFs arranged in n stages, in each stage of which the FFs are successively connected in series, plural logic gates, output terminals of which are respectively connected with input terminals of the plural FFs, and a scan path which is formed of a series connection of a part or the whole of the plural FFs, and which propagates a test pattern for measuring an AC characteristic of an input or output terminal of the logical integrated circuit, comprises the steps of:

connecting a scan input with an input terminal of the FF located the head of the nth stage, connecting the FFs arranged in the second to (n−1)th stages successively in series, after restarting from an output terminal of the FF located at the end of the nth stage, connecting an output terminal of the FF located at the end of the (n−1)th stage with an input terminal of the FF located at the head of the first stage, connecting an output terminal of the FF located at the end of the first stage with a scan output, inputting a clock signal to a clock signal input terminal, inputting a predetermined data signal to one of the input terminals of the logical integrated circuit, and measuring the AC characteristic of the one of the input terminals of the logical integrated circuit by inspecting an output of the scan output.

According to a seventh feature of the invention, a method for testing a logical integrated circuit, which is composed of:

plural FFs arranged in n stages, in each stage of which the FFs are successively connected in series, plural logic gates, output terminals of which are respectively connected with input terminals of the plural FFs, and a scan path which is formed of a series connection of a part or all of the plural FFs, and which propagates a test pattern for measuring an AC characteristic of an input or output terminal of the logical integrated circuit, comprises the steps of:

connecting a scan input with an input terminal of the FF located the head of the nth stage, connecting the FFs arranged in the second to (n−1) th stages successively in series, after restarting from an output terminal of the FF located at the end of the nth stage, connecting an output terminal of the FF located at the end of the (n−1) th stage with an input terminal of the FF located at the head of the first stage, connecting an output terminal of the FF located at the end of the first stage with a scan output, inputting a clock signal to a clock signal input terminal, inputting a predetermined data signal to a scan input, and measuring an AC characteristic of one of the output terminals of the logical integrated circuit by inspecting an output of the one of the output terminals.

BRIEF DESCRIPTION OF DRAWINGS

The invention will be explained in more detail in conjunction with appended drawings, wherein.

DESCRIPTION OF PREFERRED EMBODIMENTS

Next, preferred embodiments of the invention will be explained referring to the appended drawings.

Figure 3:
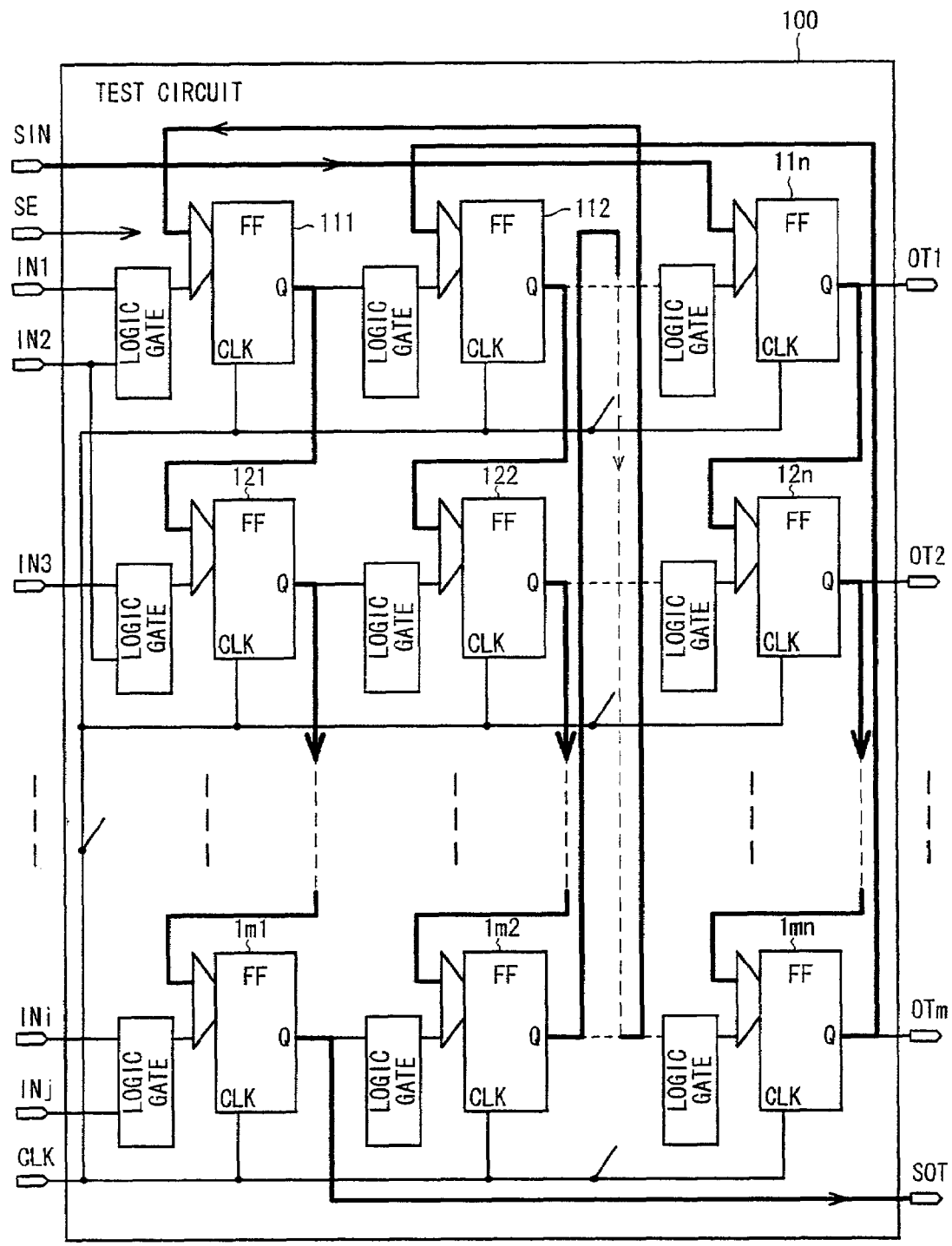
FIG. 3 is a block diagram for showing a test circuit for a logical integrated circuit according to a first preferred embodiment of the invention.

FIG. 3 is a block diagram for showing a first preferred embodiment of the invention. A test circuit 100 for a logical integrated circuit is provided with input terminals IN1, IN2 to INi, INj, a clock signal input terminal CLK, output terminals OT1, OT2 to Otm, a scan input SIN, a scan output SOT, and a scan enable terminal SE. As shown in FIG. 3, the m×n FFs are arranged in the form of a matrix in the test circuit 100, that is to say, the n stages of FFs, each of which is composed of m FFs, are successively arranged to form a matrix of m rows and n columns. Explaining concretely, the m FFs composed of FF111, FF121 to FF1m1 form the first stage, located the closest to the input terminals SIN to Inj, and the m FFs composed of FF11n, FF12n to FF1mn form the n-th (final) stage, located the closest to the output terminals OT1 to OTm.

A higher input terminal of each FF of the scanning type is connected with the scan path, and a lower input terminal of the same is connected with an output terminal of a logic gate. Either the scan path or the logic gate is selected in accordance with a control voltage outputted from the scan enable terminal SE, and the data selected in this way is taken in the FF. An output terminal Q of each FF is connected with a lower input terminal of a FF located in the next stage via a logic gate and with a higher input terminal of the following FF in the scan path.

The data signals inputted to the input terminals IN1, IN2 are supplied to the input terminals of a logic gate, the output of which is taken in FF111 located at the head of the first stage. The data signals inputted to the input terminals IN2, IN3 are supplied to the input terminals of another logic gate, the output of which is taken in FF121. The data signals inputted to the input terminals INi, INj are supplied to the input terminals of a logic gate, the output of which is taken in FF1m1. FF11n, located the closest to the output terminals, supplies the output signal to the output terminal OT1. FF12n supplies the output signal to the output terminal OT2. FF1mn supplies the output signal to the output terminal OTm.

In a part of the scan path lying in the xth stage of the test circuit, the m FFs composed of FF11x, FF12x to FF1mx are successively connected in series.

In the scan path of the test circuit 100 shown in FIG. 3, the scan input SIN is connected with the input terminal of FF11n located at the head of the nth stage, and the m FFs composed of FF11n to FF1mn are successively connected in series. Then, the output terminal Q of FF1mn, located at the end of the nth stage, is connected with the input terminal of FF112, located at the head of the second stage. Thereafter, the internal FFs (the FFs arranged in the second to (n−1) th stages) are successively connected in series, and FF1m(n−1) (not shown), located at the end of the (n−1)th stage, is connected with the m FFs arranged in the first stage in series. Finally, the output terminal Q of FF1m1, located at the end of the first stage, is connected with the scan output SOT.

Next, the operation of the test circuit 100 shown in FIG. 3 will be explained referring to the appended drawings.

First, a procedure for generating a test pattern for measuring the AC characteristic of the input terminal IN1 will be discussed in the case in which the data applied to the input terminal IN1 changes to "1" from "0" and the data applied to the other input terminal IN2 is kept to be "1". When the data applied to the input terminals IN1, IN2 are respectively "0.1", a data "0" is taken in the FF111. When the data applied to the input terminals IN1, IN2 are respectively "1,1,", the data "1" is taken in the FF111.

Accordingly, when the data "0.1" are respectively inputted to the input terminals IN1, IN2 in the first place, the data "0" is taken in the FF111. In the test circuit 100, since the m FFs composed of FF111 to FF1m1 are arranged in the final stage of the scan path and are connected in series to form a shift register, the data "0" taken in the FF111 is successively shifted along the following FFs composed of FF121 to FF1m1, and finally is transmitted to the scan output SOT, through which the data "0" can be observed.

Next, when the data "1,1" are respectively inputted to the input terminals IN1, IN2, the data "1" is taken in the FF111. Similarly to the above explanation, the data "1" can be observed through the scan output SOT.

By using the test pattern generated in this way, the time when the data applied to the input terminal IN1 changes into "1" from "0" is shifted forward and backward, and whether the data inputted to the input terminal IN1 is taken in the FFs correctly or not is judged on the LSI tester. The AC characteristic of the input terminal IN1 can be determined from the delay time of the data signal relative to the clock signal on the basis of the aforementioned judgement.

On the other hand, in order to generate a test pattern for measuring the AC characteristic of the output terminal OTm in the case in which the data applied to the output terminal OTm changes into "1" from "0", it is necessary that the data applied to the output terminal Q of the FF1mn change into "1" from "0". Accordingly, the data "0" is inputted through the scan input SIN in the first place, and the data "0" is taken in FF11n.

Next, the data "1" is inputted through the scan input SIN, taken in FF11n, successively shifted along the scan path, and observed through the output terminal OTm. The AC characteristics of the output terminal OTm can be determined by using the test pattern generated in this way.

In the above explanation, the test circuit is composed of the m×n FFs arranged in the form of a matrix, the first to nth columns of which respectively correspond to the first to nth stages of the test circuit. Each stage of the test circuit is composed of the m FFs connected in series, and the FFs arranged in the respective stages are connected in series in accordance with a predetermined order to form a scan path. However, the form of the arrangement of the FFs is never restricted to that of the matrix, and there is no limitation on the number of FFs in each stage. Moreover, although it is necessary to arrange the FFs connected in series the closest to both the input and output terminals, there is no limitation on the other FFs which are connected in series in the internal part of the test circuit, because these internal FFs are provided for the test circuit in accordance with the strictures and the combinations of the logic gates, and the arrangement of them is never restricted by the above explanations.

Next, a second preferred embodiment of the invention will be explained referring to FIG. 4.

Figure 4:
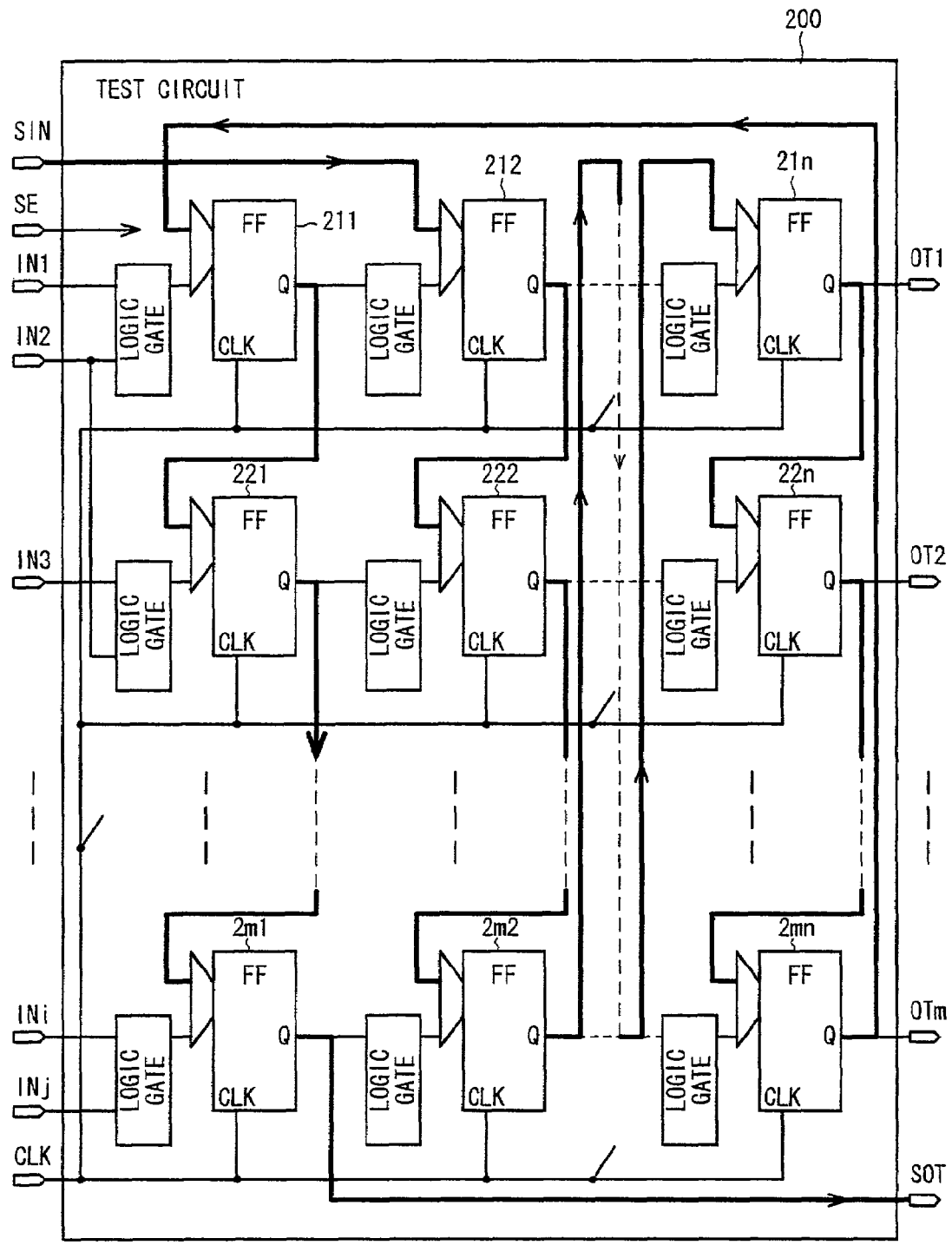
FIG. 4 is a block diagram for showing a test circuit for a logical integrated circuit according to a second preferred embodiment of the invention.

Since the arrangement of the input terminals INx, the output terminals OTx and FF2mn in the test circuit 200 shown in FIG. 4 is the same as that of the test circuit 100 shown in FIG. 3, a detailed explanation thereof will be omitted. The distinction between the test circuits 100, 200 consists in the route of the scan path.

Figure 1:
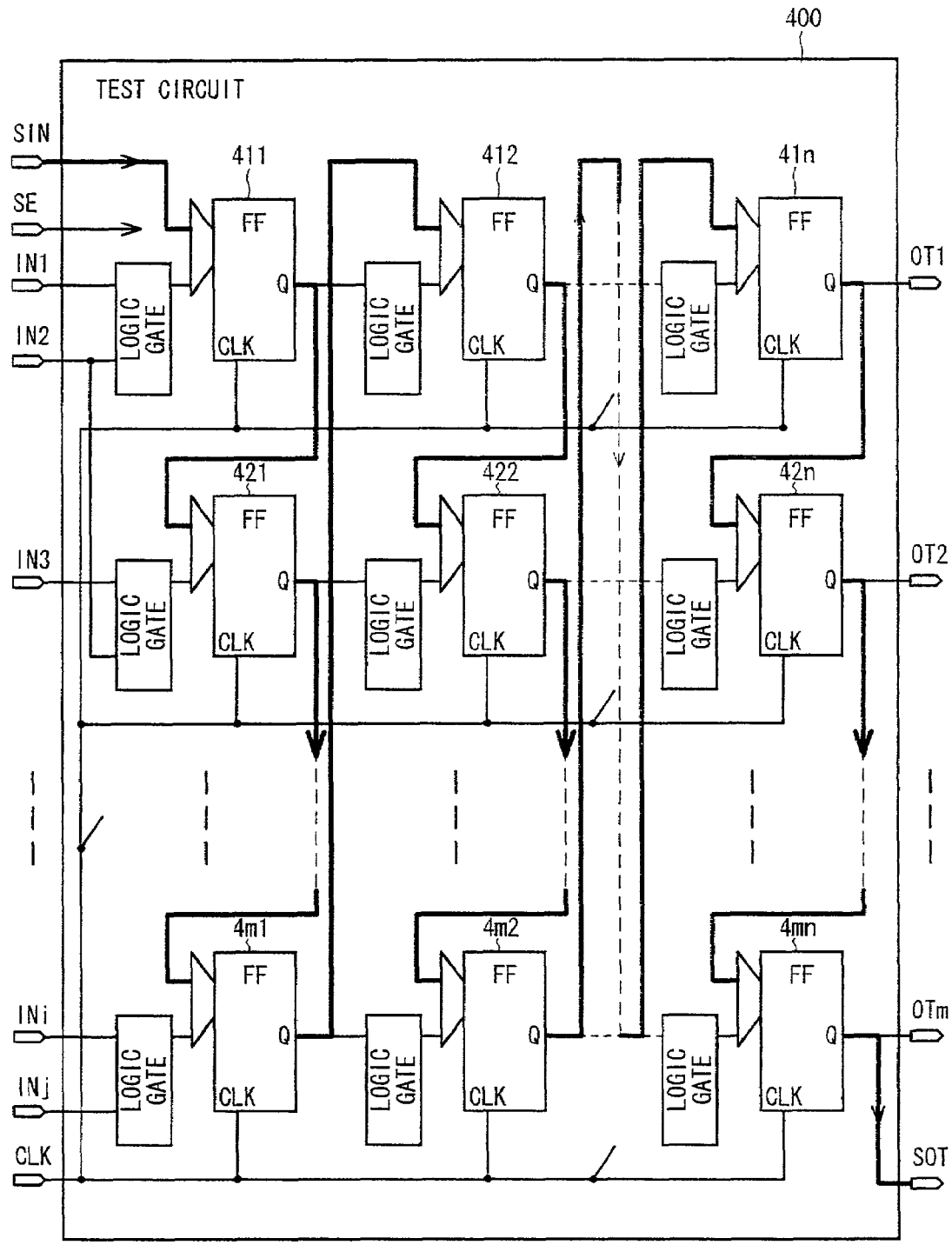
FIG. 1 is a block diagram for showing a typical example of a conventional test circuit for a logical integrated circuit.
Figure 2:
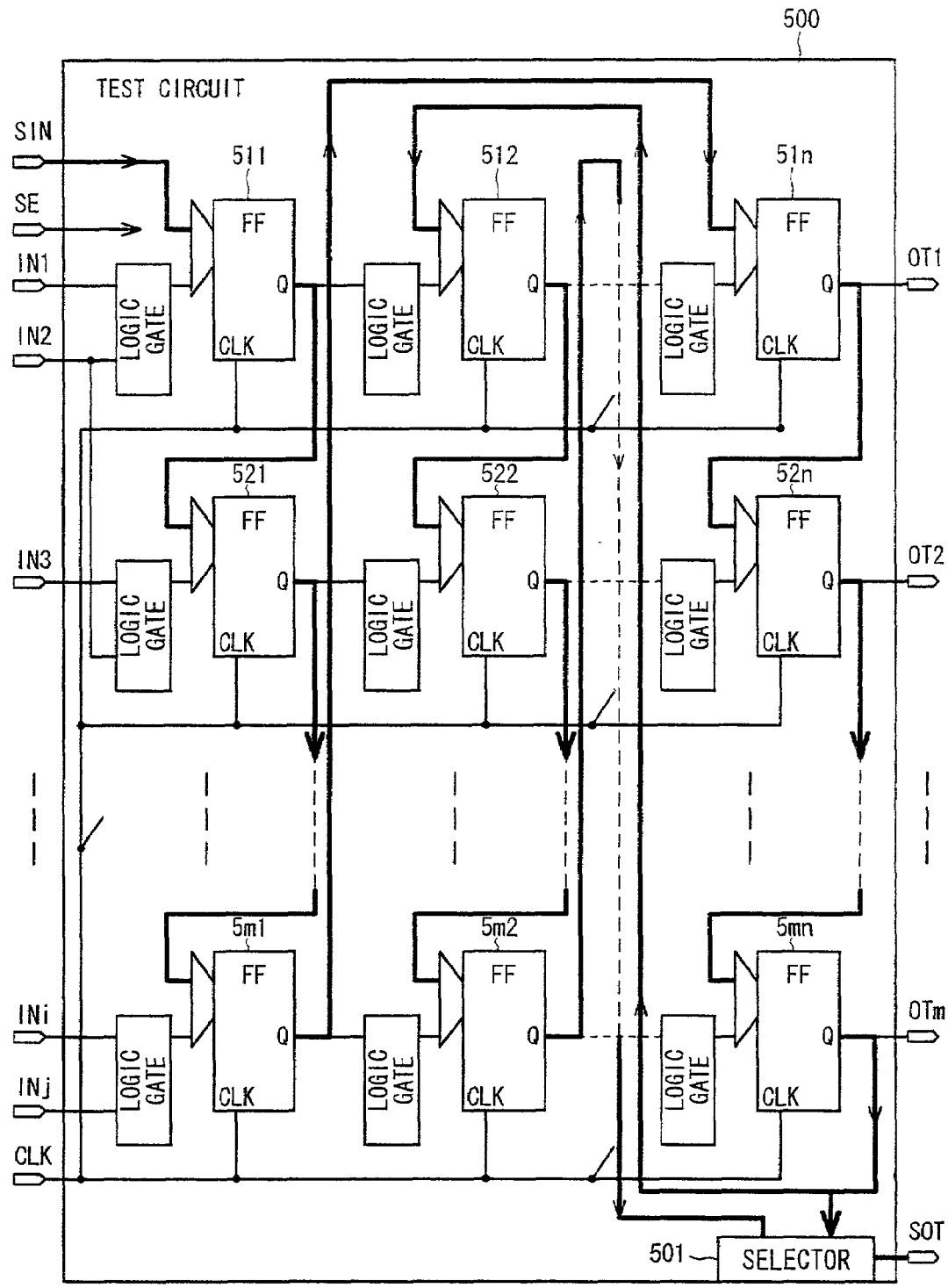
FIG. 2 is a block diagram for showing another example of a conventional test circuit for a logical integrated circuit.

In the scan path of the test circuit shown in FIG. 4, the scan input SIN is connected with the input terminal of FF212 located at the head of the second stage of the test circuit, and the output terminal Q of FF2mn, located at the end of the nth stage, is connected with the input terminal of FF211 located at the head of the first stage. Accordingly, a point of difference between the test circuit 200 shown in FIG. 4 and the test circuit 400 shown in FIG. 1 consists in the fact the m FFs arranged in the first stage are connected with the scan output SOT in the test circuit 200 to form the scan path.

Similarly to the test circuit 100 shown in FIG. 3, when a test pattern for measuring the AC characteristic of the input terminal IN1 in the test circuit 200 is generated, the data signals are respectively inputted to the input terminals IN1, IN2, and the clock signal is inputted to the clock signal input terminal CLK. The data signals inputted to the input terminals IN1, IN2 are supplied to the input terminals of the logic gate, the output signal of which is taken in FF211. The data taken in FF211 is successively shifted along the scan path which connects FF211 to FF2m1 in series, transmitted to the scan output SOT, and observed therethrough.

By using the test pattern generated in this way, the data signal inputted through the input terminal IN1 is shifted forward and backward, and whether the inputted data signal is taken in the FFs correctly or not is judged. The AC characteristic of the input terminal IN1 is determined through the delay time of the data signal relative to the clock signal on the basis of the aforementioned judgement.

Next, a third preferred embodiment of the invention will be explained referring to FIG. 5.

Figure 5:
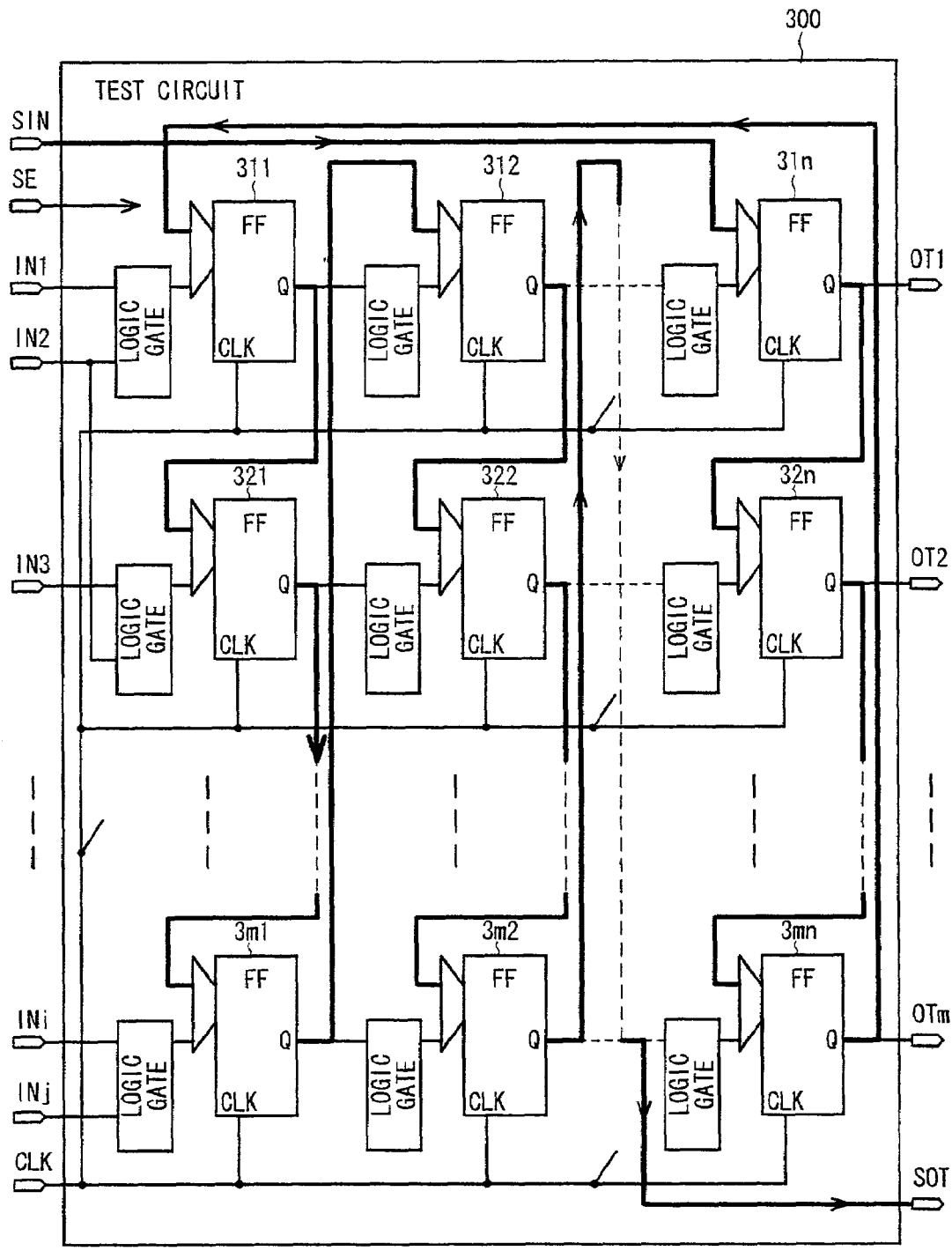
FIG. 5 is a block diagram for showing a test circuit for a logical integrated circuit according to a third preferred embodiment of the invention.

In the test circuit 300 shown in FIG. 5, since the arrangement of the input and output terminals INx, OTx, and FF3mn is the same as that shown in FIG. 3, detailed explanations thereof will be omitted. The distinction between the test circuits 100, 300 consists in the route of the scan path.

That is to say, in the scan path of the test circuit 300 shown in FIG. 5, the scan output SOT is connected with the output terminal Q of FF3m(n−1) (not shown) located at the end of the (n−1)th stage of the test circuit, and the output terminal Q of FF3m1, located at the end of the first stage, is connected with the input terminal of FF312 located at the head of the second stage. The distinction between the test circuit 400 shown in FIG. 1 and the test circuit 300 shown in FIG. 5 consists in the fact that the m FFs arranged in the nth stage in the test circuit 300 are connected with the scan input SIN to form the scan path.

Similarly to the test circuit 100 shown in FIG. 3, in order to generate the test pattern for measuring the AC characteristic of the output terminal OTm when the data applied thereto changes, since it is necessary that the data outputted from FF3mn changes, the data is inputted through the scan input SIN, and taken in the FF31n in the first place. Since the FF31n to FF3mn are connected in series to form the scan path in the test circuit 300, the data inputted through the scan input SIN is successively shifted along FF32n to FF3mn forming a shift register, and finally transmitted to FF3mn. The data applied to the output terminal Q of FF3mn can be observed through the output terminal OTm.

Next, other data is inputted from the scan input SIN, and the data supplied to the input terminal of FF31n can be observed through the output terminal OTm. The AC characteristic of the output terminal OTm can be determined by using the test patterns obtained by the aforementioned procedures.

As mentioned in the above, according to the invention, the AC characteristics of the input and output terminals can be respectively measured in a short time.

In the test circuit according to the invention, since each input terminal is connected with the scan output via the scan path which is formed only of the FFs arranged the closest to the input terminals, and, moreover, each output terminal is connected with the scan input via the scan path which is formed only of the FFs arranged the closest to the output terminals, the number of scan shifts in the test circuit according to the invention can be reduced by half approximately as compared with that in the conventional test circuit disclosed in Japanese Patent No. 309204, in which the scan path is formed of a series connection of the first plural FFs arranged the closest to the input terminals and the second FFs arranged the closest to the output terminals.

Although the invention has been described with respect to specific embodiments for complete and clear disclosure, the appended claims are not to be thus limited but are to be construed as embodying all modification and alternative constructions that may occur to one skilled in the art which fairly fall within the basic teaching herein set forth.

What is claimed is:

1. A test circuit for a logical integrated circuit having an input terminal, a functional output terminal, and a scan output terminal, said test circuit comprising:
a plurality of flip-flops, each flip-flop having an input terminal and an output terminal, said flip-flops being arranged in a matrix having n stages, each stage comprising m flip-flops,
a like plurality of logic gates, each logic gate having an output terminal connected to an input terminal of a respective one of said plurality of flip-flops, and
means forming a scan path serially connecting said plurality of flip-flops through the respective logic gates, to propagate a test pattern applied to the input terminal of one of said plurality of serially connected flip-flops, wherein:
the test pattern is used to measure an alternating current characteristic of the input terminal of said logical integrated circuit, and
said scan path connects the output terminal of the flip-flop located at an end of the first stage with the scan output terminal of said logical integrated circuit.

2. A test circuit for a logical integrated circuit having a functional input terminal, an output terminal, and a scan input terminal, said test circuit comprising:
a plurality of flip-flops, each flip-flop having an input terminal and an output terminal, said flip-flops being arranged in a matrix having n stages, each stage comprising m flip-flops,
a like plurality of logic gates, each logic gate having an output terminal connected to an input terminal of a respective one of said plurality of flip-flops, and
means forming a scan path serially connecting said plurality of flip-flops through the respective logic gates, to propagate a test pattern applied to the input terminal of one of said plurality of serially connected flip-flops, wherein:
the test pattern is used to measure an alternating current characteristic of the output terminal of said logical integrated circuit, and
said scan path connects the scan input terminal of said logical integrated circuit with the input terminal of the flip-flop located at the head of the nth stage.

3. A test circuit for a logical integrated circuit having an input terminal, a functional output terminal, and a scan output terminal, said test circuit comprising:
a plurality of flip-flops, each flip-flop having an input terminal and an output terminal, said flip-flops being arranged in a matrix having n stages, each stage comprising m flip-flops,
a like plurality of logic gates, each logic gate having an output terminal connected to an input terminal of a respective one of said plurality of flip-flops, and
means forming a scan path serially connecting said plurality of flip-flops through the respective logic gates, to propagate a test pattern applied to the input terminal of one of said plurality of serially connected flip-flops, wherein:
the test pattern is used to measure an alternating current characteristic of the input terminal of said logical integrated circuit,
said scan path connects the scan input with the input terminal of the flip-flop located at the head of the nth stage,
from the output terminal of the flip-flop located at the end of the nth stage, said scan path further connects the flip-flops in the second to the (n−1)th stages in series, said scan path then connects the output terminal of the flip-flop located at the end of the (n−1)th stage with the input terminal of the flip-flop located at the head of the first stage, and
the scan path finally connects the output terminal of the flip-flop located at the end of the first stage with the scan output terminal of said logical integrated circuit.

4. A method of testing a logical integrated circuit, the logical integrated circuit comprising:
an input terminal,
a functional output terminal,
a scan output terminal,
a plurality of flip-flops, each flip-flop having an input terminal and an output terminal, said flip-flops being arranged in a matrix having n stages, each stage comprising m flip-flops,
a like plurality of logic gates, each logic gate having an output terminal connected to an input terminal of a respective one of said plurality of flip-flops, and
means forming a scan path serially connecting said plurality of flip-flops through the respective logic gates, to propagate a test pattern applied to the input terminal of one of said plurality of serially connected flip-flops, the test pattern enabling measurement of an alternating current characteristic of the input terminal of said logical integrated circuit by inspecting an output of the scan output terminal of said logical integrated circuit, said method comprising:
connecting the output terminal of the flip-flop located at the end of the first stage with the scan output terminal of said logical integrated circuit,
inputting a clock signal to a clock signal input terminal of each of said flip-flops,
inputting a predetermined data signal to the input terminal of said logical integrated circuit, and
measuring the alternating current characteristic of the input terminal of said logical integrated circuit by inspecting the output of the scan output terminal of said logical integrated circuit.

5. A method of testing a logical integrated circuit, the logical integrated circuit comprising:
a functional input terminal,
an output terminal,
a scan input terminal,
a plurality of flip-flops, each flip-flop having an input terminal and an output terminal, said flip-flops being arranged in a matrix having n stages, each stage comprising m flip-flops,
a like plurality of logic gates, each logic gate having an output terminal connected to an input terminal of a respective one of said plurality of flip-flops, and
means forming a scan path serially connecting said plurality of flip-flops through the respective logic gates, to propagate a test pattern applied to the input terminal of one of said plurality of serially connected flip-flops, the test pattern enabling measurement of an alternating current characteristic of the output terminal of said logical integrated circuit by inspecting an output of the output terminal of said logical integrated circuit, said method comprising:
connecting the scan input terminal of said logical integrated circuit with the input terminal of the flip-flop located at the head of the nth stage,
inputting a clock signal to a clock signal input terminal of each of said flip-flops,
inputting a predetermined data signal to the scan input terminal of said logical integrated circuit, and measuring the alternating current characteristic of the output terminal of said logical integrated circuit by inspecting the output of the output terminal of said logical integrated circuit.

6. A method of testing a logical integrated circuit, the logical integrated circuit comprising:
 a functional input terminal
 a functional output terminal,
 a scan input terminal,
 a scan output terminal,
 a plurality of flip-flops, each flip-flop having an input terminal and an output terminal, said flip-flops being arranged in a matrix having n stages, each stage comprising m flip-flops,
 a like plurality of logic gates, each logic gate having an output terminal connected to an input terminal of a respective one of said plurality of flip-flops, and
 means forming a scan path serially connecting said plurality of flip-flops through the respective logic gates, to propagate a test pattern applied to the input terminal of one of said plurality of serially connected flip-flops, the test pattern enabling measurement of an alternating current characteristic of the functional input terminal of said logical integrated circuit by inspecting an output of the scan output terminal of said logical integrated circuit, said method comprising:
 connecting the output terminal of the flip-flop located at the end of the nth stage with the input terminal of the flip-flop located at the head of the second stage,
 connecting the flip-flops in the second to the (n−1)th stages in series,
 connecting the output terminal of the flip-flop located at the end of the (n−1)th stage with the input terminal of the flip-flop located at the head of the first stage,
 connecting the output terminal of the flip-flop located at the end of the first stage with the scan output terminal of said logical integrated circuit,
 inputting a clock signal to a clock signal input terminal of each of said flip-flops,
 inputting a scan input signal to the scan input terminal of said logical integrated circuit,
 inputting a predetermined data signal to the functional input terminal of said logical integrated circuit, and
 measuring the alternating current characteristic of the functional input terminal of said logical integrated circuit by inspecting the output of the scan output terminal of said logical integrated circuit.

7. A method of testing a logical integrated circuit, the logical integrated circuit comprising:
 a functional input terminal
 a functional output terminal,
 a scan input terminal,
 a scan output terminal,
 a plurality of flip-flops, each flip-flop having an input terminal and an output terminal, said flip-flops being arranged in a matrix having n stages, each stage comprising m flip-flops,
 a like plurality of logic gates, each logic gate having an output terminal connected to an input terminal of a respective one of said plurality of flip-flops, and
 means forming a scan path serially connecting said plurality of flip-flops through the respective logic gates, to propagate a test pattern applied to the input terminal of one of said plurality of flip-flops, the test pattern enabling measurement of an alternating current characteristic of the functional output terminal of said logical integrated circuit by inspecting an output of the output terminal of said logical integrated circuit, said method comprising:
 connecting the scan input terminal of said logical integrated circuit with the input terminal of the flip-flop located at the head of the nth stage,
 connecting the output terminal of the flip-flop located at the end of the nth stage with the input terminal of the flip-flop located at the head of the second stage,
 connecting the output terminal of the flip-flop located at the end of the (n−1)th stage with the input terminal of the flip-flop located at the head of the first stage,
 connecting the output terminal of the flip-flop located at the end of the first stage with the scan output terminal of said logical integrated circuit,
 inputting a clock signal to a clock signal input terminal of each of said flip-flops,
 inputting a predetermined data signal to the scan input terminal of said logical integrated circuit, and
 measuring the alternating current characteristic of the functional output terminal of said logical integrated circuit by inspecting the output of the output terminal of said logical integrated circuit.

8. A test circuit for a logical integrated circuit having an input terminal, a functional output terminal, and a scan output terminal, said test circuit comprising:
 a plurality of flip-flops, each flip-flop having an input terminal and an output terminal, said flip-flops being arranged in a matrix having n stages, each stage comprising m flip-flops, and
 means forming a scan path serially connecting said plurality of flip-flops, to propagate a test pattern applied to the input terminal of one of said plurality of serially connected flip-flops, wherein:
 the test pattern is used to measure an alternating current characteristic of the input terminal of said logical integrated circuit, and
 said scan path connects the output terminal of the flip-flop located at an end of the first stage with the scan output terminal of said logical integrated circuit.

9. A test circuit for a logical integrated circuit having a functional input terminal, an output terminal, and a scan input terminal, said test circuit comprising:
 a plurality of flip-flops, each flip-flop having an input terminal and an output terminal, said flip-flops being arranged in a matrix having n stages, each stage comprising m flip-flops, and
 means forming a scan path serially connecting said plurality of flip-flops, to propagate a test pattern applied to the input terminal of one of said plurality of serially connected flip-flops, wherein:
 the test pattern is used to measure an alternating current characteristic of the output terminal of said logical integrated circuit, and
 said scan path connects the scan input terminal of said logical integrated circuit with the input terminal of the flip-flop located at the head of the nth stage.

10. A test circuit for a logical integrated circuit having an input terminal, a functional output terminal, and a scan output terminal, said test circuit comprising:
 a plurality of flip-flops, each flip-flop having an input terminal and an output terminal, said flip-flops being arranged in a matrix having n stages, each stage comprising m flip-flops connected in series, and
 means forming a scan path to propagate a test pattern applied to the input terminal of one of said plurality of flip-flops, wherein:

the test pattern is used to measure an alternating current characteristic of the input terminal of said logical integrated circuit, said scan path connects the scan input with the input terminal of the flip-flop located at the head of the nth stage, said scan path connects the output terminal of the flip-flop located at the end of the nth stage to the flip-flop at the head of the second stage, said scan path then connects the output terminal of the flip-flop located at the end of the (n−1)th stage with the input terminal of the flip-flop located at the head of the first stage, and the scan path finally connects the output terminal of the flip-flop located at the end of the first stage with the scan output terminal of said logical integrated circuit.

11. A method of testing a logical integrated circuit, the logical integrated circuit comprising:

an input terminal, a functional output terminal, a scan output terminal, a plurality of flip-flops, each flip-flop having an input terminal and an output terminal, said flip-flops being arranged in a matrix having n stages, each stage comprising m flip-flops, and means forming a scan path serially connecting said plurality of flip-flops, to propagate a test pattern applied to the input terminal of one of said plurality of serially connected flip-flops, the test pattern enabling measurement of an alternating current characteristic of the input terminal of said logical integrated circuit by inspecting an output of the scan output terminal of said logical integrated circuit, said method comprising:

connecting the output terminal of the flip-flop located at the end of the first stage with the scan output terminal of said logical integrated circuit, inputting a clock signal to a clock signal input terminal of each of said flip-flops, inputting a predetermined data signal to the input terminal of said logical integrated circuit, and measuring the alternating current characteristic of the input terminal of said logical integrated circuit by inspecting the output of the scan output terminal of said logical integrated circuit.

12. A method of testing a logical integrated circuit, the logical integrated circuit comprising:

a functional input terminal, an output terminal, a scan input terminal, a plurality of flip-flops, each flip-flop having an input terminal and an output terminal, said flip-flops being arranged in a matrix having n stages, each stage comprising m flip-flops, and means forming a scan path serially connecting said plurality of flip-flops, to propagate a test pattern applied to the input terminal of one of said plurality of serially connected flip-flops, the test pattern enabling measurement of an alternating current characteristic of the output terminal of said logical integrated circuit by inspecting an output of the output terminal of said logical integrated circuit, said method comprising:

connecting the scan input terminal of said logical integrated circuit with the input terminal of the flip-flop located at the head of the nth stage, inputting a clock signal to a clock signal input terminal of each of said flip-flops, inputting a predetermined data signal to the scan input terminal of said logical integrated circuit, and measuring the alternating current characteristic of the output terminal of said logical integrated circuit by inspecting the output of the output terminal of said logical integrated circuit.

13. A method of testing a logical integrated circuit, the logical integrated circuit comprising:

a functional input terminal a functional output terminal, a scan input terminal, a scan output terminal, a plurality of flip-flops, each flip-flop having an input terminal and an output terminal, said flip-flops being arranged in a matrix having n stages, each stage comprising m flip-flops connected in series, and means forming a scan path to propagate a test pattern applied to the input terminal of one of said plurality of flip-flops, the test pattern enabling measurement of an alternating current characteristic of the functional input terminal of said logical integrated circuit by inspecting an output of the scan output terminal of said logical integrated circuit, said method comprising:

connecting the scan input terminal of said logical integrated circuit with the input terminal of the flip-flop located at the head of the nth stage, connecting the output terminal of the flip-flop located at the end of the nth stage with the input terminal of the flip-flop located at the head of the second stage, connecting the output terminal of the flip-flop located at the end of the (n−1)th stage with the input terminal of the flip-flop located at the head of the first stage, connecting the output terminal of the flip-flop located at the end of the first stage with the scan output terminal of said logical integrated circuit, inputting a clock signal to a clock signal input terminal of each of said flip-flops, inputting a scan input signal to the scan input terminal of said logical integrated circuit, inputting a predetermined data signal to the functional input terminal of said logical integrated circuit, and measuring the alternating current characteristic of the functional input terminal of said logical integrated circuit by inspecting the output of the scan output terminal of said logical integrated circuit.

14. A method of testing a logical integrated circuit, the logical integrated circuit comprising:

a functional input terminal a functional output terminal, a scan input terminal, a scan output terminal, a plurality of flip-flops, each flip-flop having an input terminal and an output terminal, said flip-flops being arranged in a matrix having n stages, each stage comprising m flip-flops connected in series, and means forming a scan path to propagate a test pattern applied to the input terminal of one of said plurality of flip-flops, the test pattern enabling measurement of an alternating current characteristic of the functional output terminal of said logical integrated circuit by inspecting an output of the output terminal of said logical integrated circuit, said method comprising:

connecting the scan input terminal of said logical integrated circuit with the input terminal of the flip-flop located at the head of the nth stage, connecting the output terminal of the flip-flop located at the end of the nth stage with the input terminal of the flip-flop located at the head of the second stage, connecting the output terminal of the flip-flop located at the end of the (n−1)th stage with the input terminal of the flip-flop located at the head of the first stage, connecting the output terminal of the flip-flop located at the end of the first stage with the scan output terminal of said logical integrated circuit, inputting a clock signal to a clock signal input terminal of each of said flip-flops, inputting a predetermined data signal to the scan input terminal of said logical integrated circuit, and measuring the alternating current characteristic of the functional output terminal of said logical integrated circuit by inspecting the output of the output terminal of said logical integrated circuit.

* * * * *